United States Patent [19]

Bauge et al.

[11] 4,400,713

[45] Aug. 23, 1983

[54] MATRIX ARRAY OF SEMICONDUCTING ELEMENTS

[75] Inventors: Michel G. Bauge, Lesigny; Pierre B. Mollier, Boissise le Roi, both of France

[73] Assignee: International Business Machines Corp., Armonk, N.Y.

[21] Appl. No.: 213,288

[22] Filed: Dec. 5, 1980

[30] Foreign Application Priority Data

Dec. 7, 1979 [FR] France .................................. 79 30421

[51] Int. Cl.³ ...................... H01L 27/10; H01L 27/02; H01L 27/04; H01L 29/56
[52] U.S. Cl. ........................................ 357/45; 357/15; 357/46; 357/48
[58] Field of Search ........................ 357/15, 45, 46, 48

[56] References Cited

FOREIGN PATENT DOCUMENTS 2009507 6/1979 United Kingdom .................. 357/45

OTHER PUBLICATIONS

Barrett et al., "Design Considerations for a High-Speed Bipolar Read-Only Memory" IEEE J. Solid-State Circuits, vol. SC-5 (10/70) pp. 196-202.
Gunn et al., "A Bipolar 16K ROM Utilizing Schottky Diode Cells" IEEE Int. Solid-State Circuits Conference (2/77) Dig. Technical Papers, pp. 118-119.
Gaensslen "Schottky Barrier Read-Only Memory" IBM Technical Disclosure Bulletin vol. 14 (6/71) p. 252.

*Primary Examiner*—Gene M. Munson
*Attorney, Agent, or Firm*—Robert J. Haase; John F. Ohlandt

[57] ABSTRACT

Integrated matrix array the points of which are defined by the intersection of the parallel lines of a first set with the parallel lines of a second set, said points being provided, or not provided, with semiconducting elements which have a first electrode connected to a line of the first set and a second electrode connected to a line of the second set, the array being of the type in which the first electrodes of the elements in each column or row are defined in a common semiconducting region, the second electrodes being provided only in the positions in which a semiconducting element is to be operative, said array being arranged such that:

(a) the semiconducting elements in each column or row are partitioned into groups of 2k elements,
(b) in each group, the semiconducting layer is partitioned into two portions, the first portion extending from one end of the group up to the position provided with the semiconducting element which is closest to the middle point of the group, and the second portion extending from the other end of the group up to the position provided with the semiconducting element which is closest to the middle point of the group.
(c) connecting means are provided to ensure the electrical connection between the ends of the two portions of the semiconducting layer.

7 Claims, 8 Drawing Figures

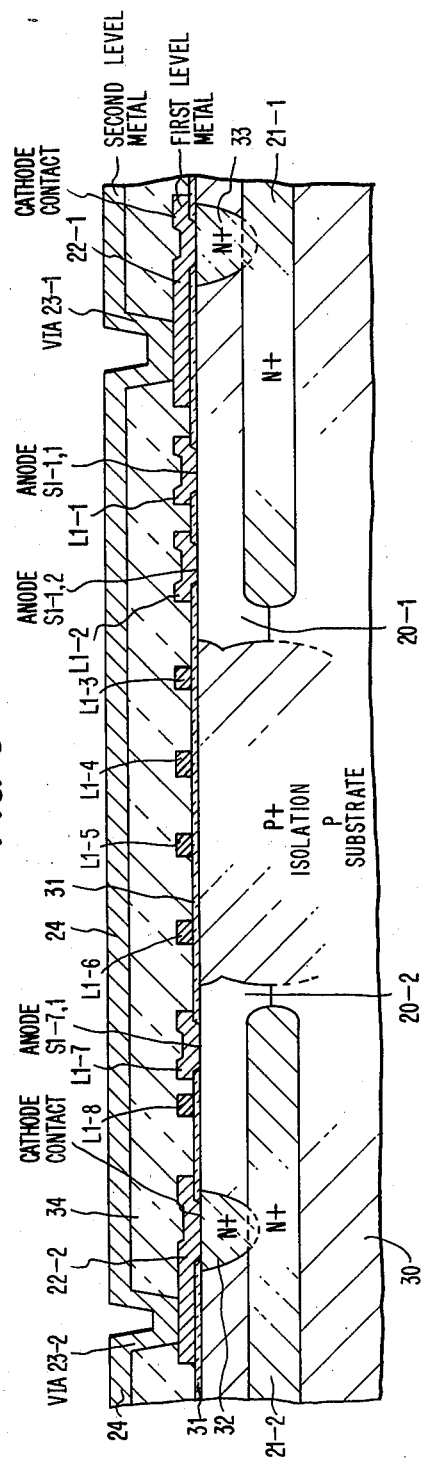
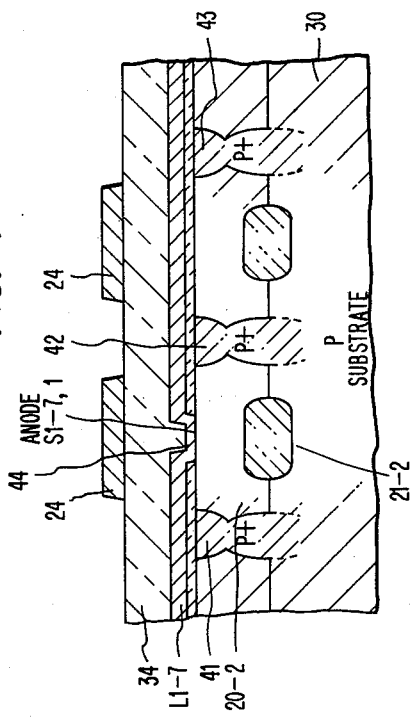

MATRIX ARRAY OF SEMICONDUCTING ELEMENTS

BACKGROUND OF THE INVENTION

1. Field of the Invention

This invention relates to arrays of semiconducting elements, such as Schottky diodes or transistors, integrated in wafers. The semiconducting elements are arranged as a matrix to make up said arrays which are customized to ensure a given function. For instance, they can be used as AND or OR matrix in programmable logic arrays (PLA) or as read-only memories provided with better characteristics of density and power dissipation.

2. Background Art

The matrix arrays of semiconducting elements making up read-only memories or the AND or OR matrix of a PLA device are today well known in the art and in current use. In particular, French Pat. No. 71 16554 describes a read-only memory including Schottky diodes as memory cells. In said read-only memory, the diodes of a given row are located in a pocket of semiconducting material forming the cathodes of said diodes and said cathodes are interconnected through an embedded layer. Isolating walls are provided between the diode columns. In such a memory, the fact that diodes are present, or are not present, represents an information bit, i.e. a "1" or a "0".

Such an arrangement is particularly advantageous since it provides a better density than in the conventional arrangements in which each diode is located in an isolation pocket. But since the embedded layer shows a resistivity which is low but cannot be neglected, it is not possible to design very dense arrays.

In general, programmable logic arrays are comprised of a AND matrix and a OR matrix which are customized to ensure a given function. The book of William N. Carr and Jack P. Mize entitled "MOS/LSI and Application" published by McGraw Hill Book Company, "Texas Instruments Electronics" series, provides a general description of programmable logic arrays. The AND and OR matrices are integrated into wafers which are customized by providing or not a semiconducting element such as a Schottky diode or a transistor on each point of the matrices in accordance with the function to be ensured by the PLA array. Therefore, when a PLA array is to be used, first of all, the contents of the various matrices must be determined and then, the wafers must be customized. In fact, said customization step is identical to the step performed for writing information into a read-only memory and therefore, the AND or OR matrices show the same structures as the read-only memories and can be embodied by applying the same processes and more particularly, by applying the processes described in the above indicated patent.

Accordingly, this invention provides arrays of semiconducting elements which can be used as read-only memories or to make up high-density programmable logic arrays the performance of which is unaffected by said high density.

SUMMARY OF THE INVENTION

This invention can be applied to any type of arrays comprised of a matrix of integrated semiconducting elements such as Schottky diodes or transistors, for instance, and customized by providing or not an element on each point of the matrix.

The matrix points are defined by the intersections of two sets of lines, the lines of the first set being perpendicular to the lines of the second set. When a Schottky diode is provided at a point, its anode is connected to the corresponding line of the first set and its cathode is connected to the corresponding line of the second set. In such an array of Schottky diodes, the diodes of a given column are embodied into, at least, an epitaxial bed, the sub-collector layer acting as a second connection line. The elements of a column are isolated from the elements of the adjacent columns by isolation walls extending up to the substrate.

In order to customize the matrix, the lay-out of each group of elements is analyzed by starting from the middle point of the group, and for the k positions of the upper portion the epitaxial bed is provided only from the first point with a diode up to the extreme upper point and it is the same for the k positions of the lower portion for which the epitaxial bed is provided only from the first point with a diode up to the extreme lower point.

Then, the customization of the array requires the provision of anode contacts on the points of the matrix provided with a diode. The first lines are arranged at the first metal level and connect all the anodes of the diodes provided in a given row.

A via and a contact are provided between the adjacent points of two contiguous groups to short-circuit the points of each group at the second metal level.

The same process is used when the semiconducting elements of the array consist in transistors. The P doped common beds (in the case of NPN transistors) make up the base regions into which the emitter regions of the transistors present in the array are diffused.

Specific features of the invention, as well as specific objects and advantages thereof, will become readily apparent from the following detailed description, taken in conjunction with the accompanying drawings.

BRIEF DESCRIPTION OF THE DRAWINGS

FIG. 3 is a cross-sectional view of the device of this invention taken along line A-A' of FIG. 2.

FIG. 4 is a cross-sectional view of said device taken along line B-B' of FIG. 2.

DESCRIPTION OF PREFERRED EMBODIMENT

Figure 1:
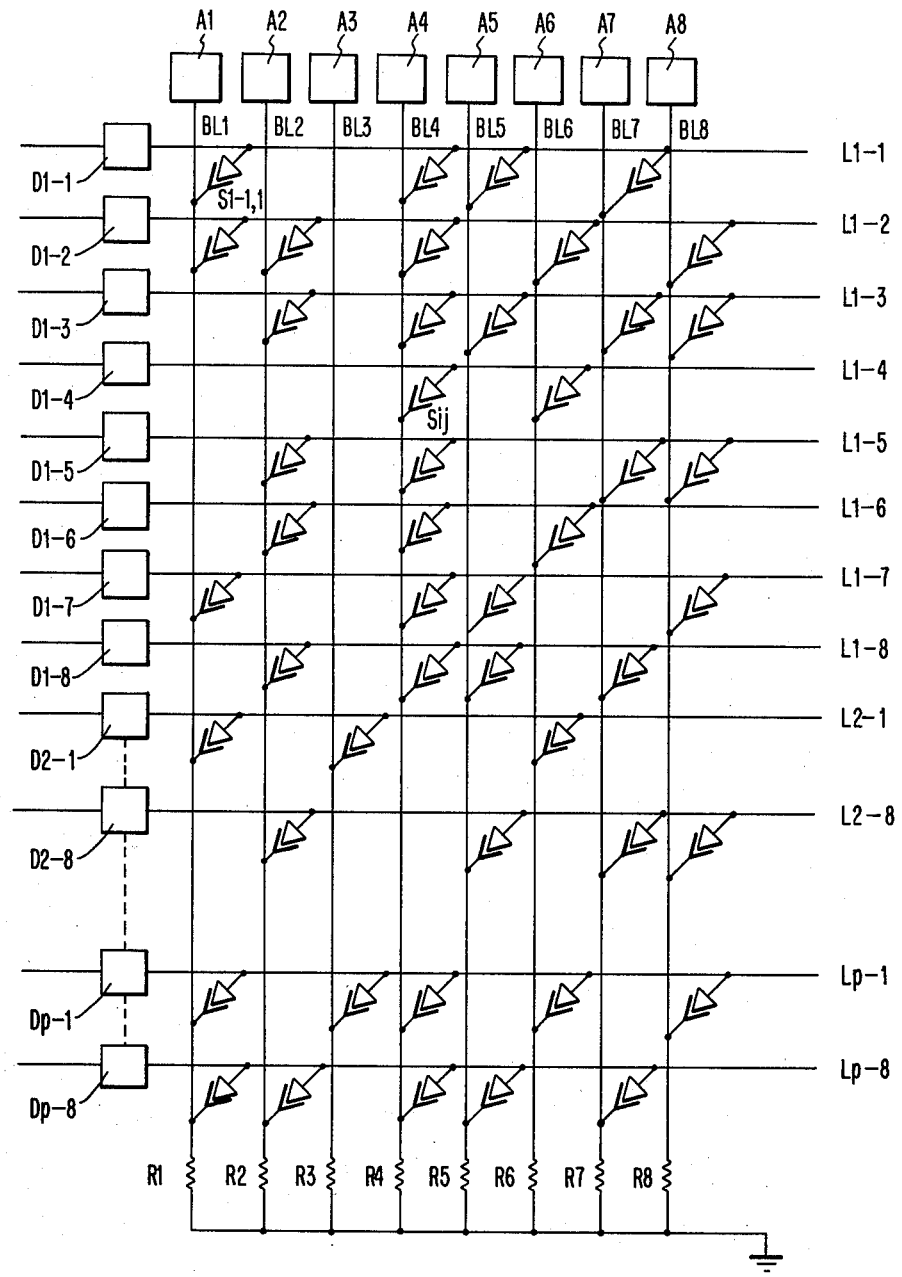
FIG. 1 schematically shows an array of Schottky diodes which can be integrated in accordance with this invention.

FIG. 1 shows an array of Schottky diodes which can be used as a read-only memory or as an OR matrix in a PLA device.

The matrix points are defined by the intersections of horizontal word lines L1-1 to L1-8, L2-1 to L2-8, . . . , Lp-1 to Lp-8 with vertical output lines BL-1 to BL-8.

The word lines are driven by control circuits D1-1 to D1-8, D2-1 to D2-8 ..., Dp-1 to Dp-8 which allow the appropriate signal levels to be established on the word lines for selecting a line or not. On the one hand, the output lines are connected to the ground through resistors R1 to R8 and, on the other hand, to detection circuits A1 to A8.

All the Schottky diodes are not referenced on the drawing in order to clarify the figure. In any diode Sij of the array, i represents the word line connected to its anode and j represents the output line connected to its cathode.

Diodes Sij are provided in some points of the matrix in accordance with a given lay-out depending on the function to be achieved by the array.

The operation of such an array is not described in this specification since it is not, per se, within the scope of the invention. When the array is used as a read-only memory, driving a particular word line causes information contained in said line to be read. Assuming that line L1-5 is selected, circuits A1 to A8 detect the state of the corresponding word, namely 01010011.

When this array is used as an OR matrix of the progammable logic array, control circuits D1-1 to Dp-8 receive the output signals from the AND matrix of the array. Logic signals applied to the control circuits are or'ed by the Schottky diodes in each column which are connected to said control circuits.

In accordance with this invention, the word lines are partitioned into p groups of 2k lines (k=4 on the drawing). All the lines of the first group are represented and bear references L1-1 to L1-8, while the lines of the following groups which are not all represented, bear references L2-1 to L2-8, ..., Lp-1 to Lp-8.

The same principle can apply to an array of Schottky diodes arranged in AND circuits in a programmable logic array. In this case the functions of the lines are reversed, i.e., the inputs are applied to the cathodes while the outputs are taken from the anodes.

Now, the structure of the array according to this invention will be described while referring to figures 2, 3 and 4 which only show the diodes of the first two columns of the first group, it being understood that this structure is the same for the other columns and groups.

Figure 2:
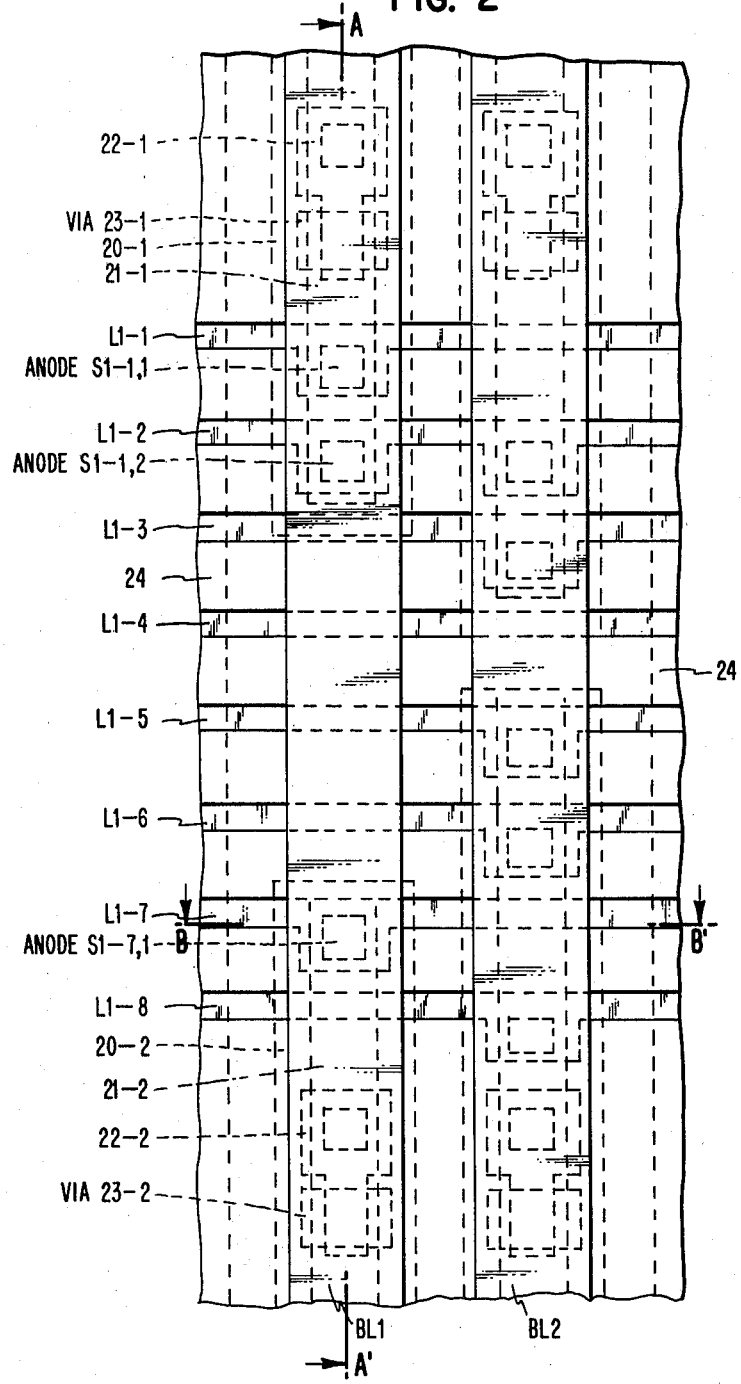
FIG. 2 is a top view of a portion of the array of FIG. 1 and illustrates the principle of operation of this invention.

FIG. 2 shows word lines L1-1 to L1-8 located at the first metal level. The diodes provided in the array are represented by the anode contact. On the figure, the anode contact of diode S1-1, 1 is indicated and it will be very easy to locate the other anode contacts of the diodes provided in the array. The diode columns are isolated by isolation walls shown in the cross section views taken along lines A–A' and B–B' for FIGS. 3 and 4, respectively. In accordance with this invention, epitaxial bed 20 and sub-collector region 21 corresponding to the cathodes of the diodes of a column, are not continuous. In a column, starting from the middle point of each group, for instance between lines L1-4 and L1-5, the epitaxial layers and the sub-collector regions are provided only from the first points provided with a diode up to ends of the group. Thus, for the left hand column of FIG. 2, layers 20 and 21 are partitioned into regions 20-1 and 20-2, and 21-1 and 21-2, which are separated by an isolation wall.

Each end of the group of diodes is provided with a Schottky cathode contact assembly 22-1 at the top, 22-2 at the bottom, at the first metal level and with a via 23-1 at the top, 23-2 at the bottom to ensure the electrical connection between the first and second metal levels.

The cathodes of the diodes of the first column are connected through regions 21-1 and 21-2 to ensure an electrical continuity and to reduce the series-resistance of the vertical line which is the output line for an array of the type shown on FIG. 1. A short circuit 24 is provided at the second metal level between the two cathode contacts 22-1 and 22-2 through vias 23-1 and 23-2. This arrangement is seen more clearly on FIG. 3.

FIG. 3 is a cross section view taken along line A–A'. The assembly integrated into a subtrate 30 of P conductivity, for instance. The figure shows both regions 20-2 and 20-1 of the epitaxial layer and subcollector regions 21-2 and 21-1.

An oxide layer 31 is provided on the semiconductor assembly, in which openings are provided to establish the anode contacts by way of the lines L1-7, L1-2 and L1-1 and the cathode contacts 22-2, 22-1, which are located at the first metal level. Two N+ regions 32 and 33 are located under contacts 22-2 and 22-1, respectively; these regions extend to their respective sub-collector layers 21-2 and 21-1, thereby to achieve the Schottky diodes.

A isolation layer 34 isolates the two metallization levels from each other. Short circuit 24 at the second metal level ensures the connection between the farthest cathode contacts of the group.

FIG. 4 is a cross section view of the structure taken along line B–B' of FIG. 2 and shows P+ isolation regions 41, 42, 43 which isolate the diodes of each column. In the same way, at the first metal level, line L1-7 is provided with an anode contact 44 to diode S1-7, in the first column (i.e. the BL1 column); however, line L1-7 does not have any anode contact in the second column, (i.e. the BL2 column) which is not provided with diodes. (see FIG. 1).

Figure 5:
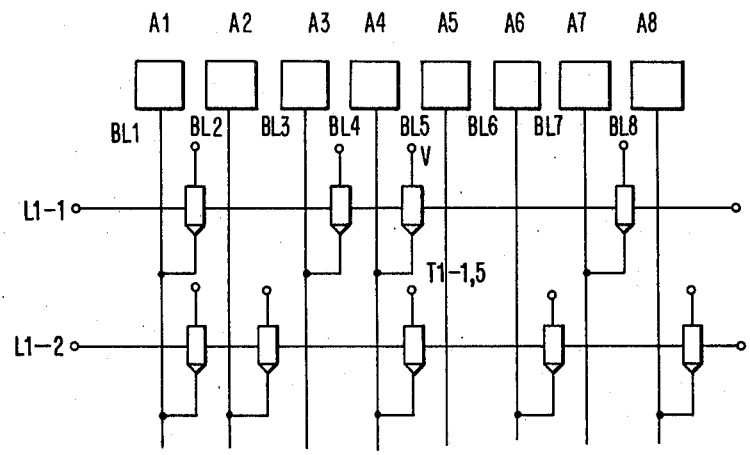
FIG. 5 is a schematic representation of a transistor array which can be integrated in accordance with this invention.

FIG. 5 shows an OR matrix in a programmable logic scheme in which the Schottky diodes are replaced by NPN transistors on the drawings. The figure shows only two word lines, L1-1 and L2-2, and eight bit lines, B1-1 to BL-8, connected to circuits A1 to A8, as seen previously in FIG. 1.

Transistors Tij are substituted for the diodes. i represents the number of word lines and j the number of bit lines. The base of transistor Tij is connected to line Li, the emitter is connected to line BLj, and the collector is connected to biasing voltage supply V.

Figure 6:
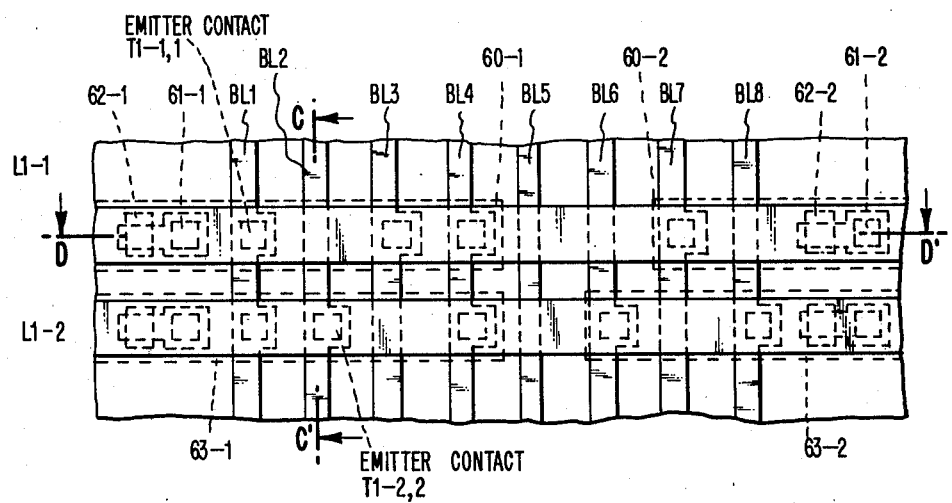
FIG. 6 is a top view of the integrated array of FIG. 5.
Figure 7:
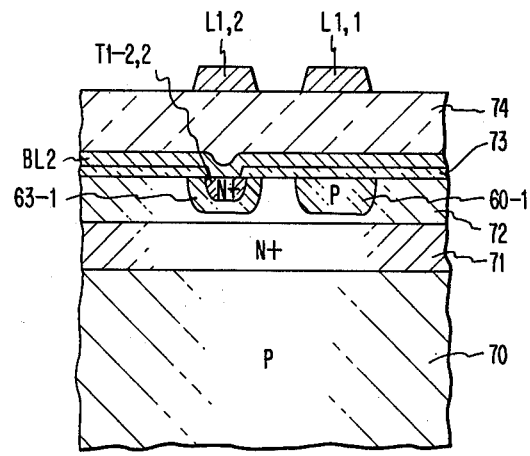
FIG. 7 is a cross-sectional view of the device of this invention taken along line C-C' of FIG. 6.
Figure 8:
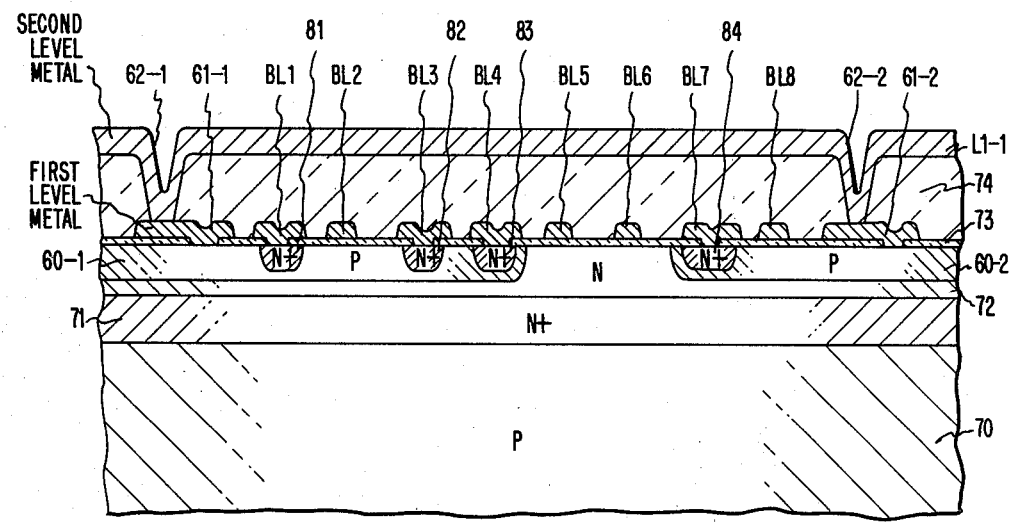
FIG. 8 is a cross-sectional view of said device taken along line D-D' of FIG. 6.

Referring now to FIGS. 6, 7 and 8, it will be shown how the transistors are integrated in accordance with this invention. As shown on FIGS. 7 and 8, the assembly is integrated into a P type substrate 70. FIG. 6, which is a top view of the structure, shows bit lines BL-1 to BL-8 with or without emitter contacts in accordance with the presence or the absence of a transistor in the corresponding point. The emitter contacts of T1-1, 1 and T1-2, 2 are indicated.

FIG. 7 is a cross section view taken along line C–C' FIG. 6 and FIG. 8 is a cross section view taken along line D–D'. To implement the principle of this invention, the eight elements connected to a line L1-1 make up a group while the elements connected to the other lines Li make up the other groups. It should be understood that since there are only eight horizontal elements, there is only one group for each line Li; however, if the number of elements is greater, it is possible to have several groups for each line Li.

A N+ type sub-collector region 71, and an N epitaxial region 72 making up the collector region common to all the transistors of the group, are provided on the substrate. On the semiconducting structure, there are an oxide layer 73 provided with the various contacts and a isolation layer 74 isolating the two metal levels.

In accordance with this invention, base diffusions are performed into each group on each side of the middle point of the group, only from the first point provided with a transistor. Thus, for the first line of elements, there are two diffused base regions 60-1 and 60-2. As for line L1-2, there are two diffused base regions 63-1 and 63-2. As assembly, comprised of base contacts 61-1 and 61-2 and vias 62-1 and 62-2, is provided at each end of the first group. A same assembly is provided at each end of each group. The base contacts are provided at the first metal level, as well as lines BL-1 to BL-8.

N+ emitter regions 81 to 84 (FIG. 8), corresponding to transistors T1-1, T1-1, 3, T1-1, 4 and T1-1, 7, are diffused into regions 60-1 and 60-2. A short circuit is provided at the second metal level through vias 62-1 and 62-2 at the base contacts located at both ends of groups 61-1 and 61-2 making up word line L1-1. This structure is repeated for all the lines of the assembly.

Thus, in the array for FIG. 7, as well as in the array of FIG. 6, the density is higher than the one obtained in the arrays in which all the elements are isolated, but the performance is not lower since the short circuits improve the characteristics of the lines over the ones of the arrays of similar density described in above indicated French Pat. No. 71 16554.

While the invention has been particularly shown and described with reference to preferred embodiments thereof, it will be understood by those skilled in the art that numerous changes in form and detail may be made therein without departing from the spirit and scope of the invention.

What is claimed is:

1. An integrated matrix array of semiconductive elements embedded in a substrate, the points of said array being defined by the intersection of parallel lines of a first set with parallel lines of a second set, said points being provided, or not provided, with said semiconductive elements which have a first electrode connected to a line of a first set and a second electrode connected to a line of a second set, the array being of the type in which the first electrodes of the semiconductive elements in each column or row are defined in a common sub-collector semiconductive region, the second electrodes being defined by contact with an epitaxial layer and provided only in positions in which a semiconductive element is to be operative, said array being arranged such that:
   (a) the semiconductive elements in each column or row are partitioned into groups of 2k elements;
   (b) in each group, said sub-collector semiconductive region and said epitaxial layer are selectively discontinuous, being partitioned into two portions, the first portion extending from one end of the group to the position having an operative semiconductive element closest to the mid-point of the group, and the second portion extending from the other end of the group to the position having an operative semiconductive element closest to the mid-point of the group;
   (c) connecting means extending between said ends of the two portions of said sub-collector semiconductive region in each group of semiconductive elements;
   (d) said substrate being of first conductivity-type, and in which in each group, said two portions comprise the semiconductive epitaxial layer and the common sub-collector semiconductive region, both of opposite conductivity-type, both portions being isolated by an isolation region of said first conductivity type.

2. An array according to claim 1 in which said connecting means include:
   (a) first and second metal levels
   (b) at both ends of each group of semiconductive elements, an assembly including a contact with the semiconductive region located at said first metal level and a via between said first and second metal levels, the two levels being isolated by a layer of isolating material,
   (c) a short cirucit provided at the second metal level between the two contacts at the ends of each group through the vias.

3. An array according to claim 2, in which the semiconductive elements comprise Schottky diodes in which the first electrodes are defined in the common semiconductive region and the second electrodes, which are selectively present, make up the anodes which are connected to the lines of the second set located at the first metal level.

4. An array according to claim 3 in which the columns or rows of diodes are isolated from each other by isolation walls of the P+ type.

5. An array according to claim 1 in which the semiconductive elements are transistors in which the first electrodes are the bases defined in the portions of the common semiconductive regions, the second electrodes which are selectively present, are the emitters which are connected to the lines of the second set located at the first metal level, the collectors of said transistors being connected to a biasing voltage supply.

6. An array according to claim 5, in which the transistors are of the NPN type and are integrated in a substrate of the P type.

7. An array according to claim 6, in which each group, both portions of the common semiconductive region have a conductivity of the P type, the emitter regions of the N+ type being diffused into corresponding points of said portions that are to be provided with a semiconductive element, said emitter regions being connected to the lines of the second set.

* * * * *